United States Patent [19]

Hertrich et al.

[11] Patent Number: 4,748,533
[45] Date of Patent: May 31, 1988

[54] INTEGRATED CIRCUIT FOR THE PROTECTION OF SUBSCRIBER LINES AGAINST OVERVOLTAGES

[75] Inventors: Helmut Hertrich, Weng; Fritz Kirschner, Lohhof; Jenö Tihanyi, Munich, all of Fed. Rep. of Germany

[73] Assignee: Siemens Aktiengesellschaft, Berlin and Munich, Fed. Rep. of Germany

[21] Appl. No.: 926,969

[22] Filed: Nov. 4, 1986

[30] Foreign Application Priority Data

Nov. 4, 1985 [DE] Fed. Rep. of Germany ....... 3539108

[51] Int. Cl.$^4$ ............................................. H02H 9/04
[52] U.S. Cl. ....................................... 361/56; 361/91; 307/631; 323/231
[58] Field of Search ..................... 361/54, 56, 91, 111; 323/223, 231; 307/631, 632, 638

[56] References Cited

U.S. PATENT DOCUMENTS

| | | | |
|---|---|---|---|
| 3,573,550 | 4/1971 | Baker, Jr. ............................... | 361/56 |
| 4,271,445 | 6/1981 | Hartmann et al. ..................... | 361/56 |
| 4,323,942 | 4/1982 | Hartman et al. ...................... | 361/56 |
| 4,400,711 | 8/1983 | Avery et al. ....................... | 361/56 X |
| 4,573,099 | 2/1986 | Ganesan et al. ...................... | 361/56 |
| 4,651,251 | 3/1987 | Thiele .................................... | 361/91 |

FOREIGN PATENT DOCUMENTS 0017980 11/1977 European Pat. Off. .
3428067 2/1985 Fed. Rep. of Germany .
2144267 2/1985 United Kingdom .

OTHER PUBLICATIONS

Elektor, vol. 9, 1983, Jul./Aug., No. 7/8, "Emergency Mains Cut-Out".

Primary Examiner—M. H. Paschall
Assistant Examiner—H. L. Williams
Attorney, Agent, or Firm—Herbert L. Lerner; Laurence A. Greenberg

[57] ABSTRACT

An integrated circuit for protecting subscriber lines against overvoltages includes a semiconductor body; a field-controllable thyristor having a gate electrode, an anode electrode and a cathode electrode, the gate electrode being insulated from the semiconductor body; a resistor connected between the cathode electrode and the gate electrode; a series circuit of Zener diodes connected between the gate electrode and the anode electrode, each of the Zener diodes having an anode electrode and a cathode electrode; and short circuit jumpers each being connected between the anode electrode and the cathode electrode of a respective one of at least part of the Zener diodes; at least part of the jumpers being interrupted corresponding to a predetermined breakdown voltage of the series circuit; and the thyristor having a larger breakdown voltage than the combined breakdown voltages of the Zener diodes of the series circuit of Zener diodes.

15 Claims, 3 Drawing Sheets

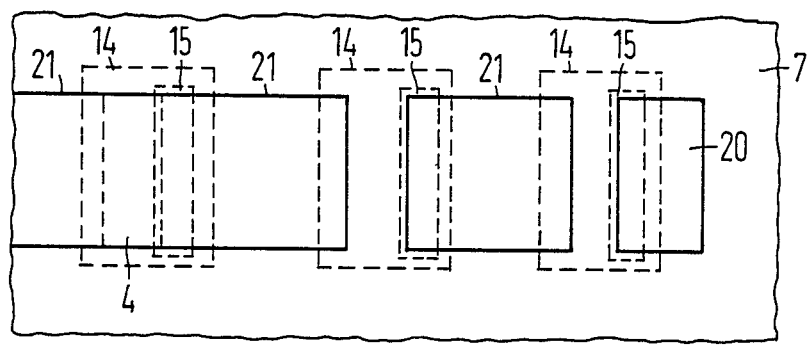
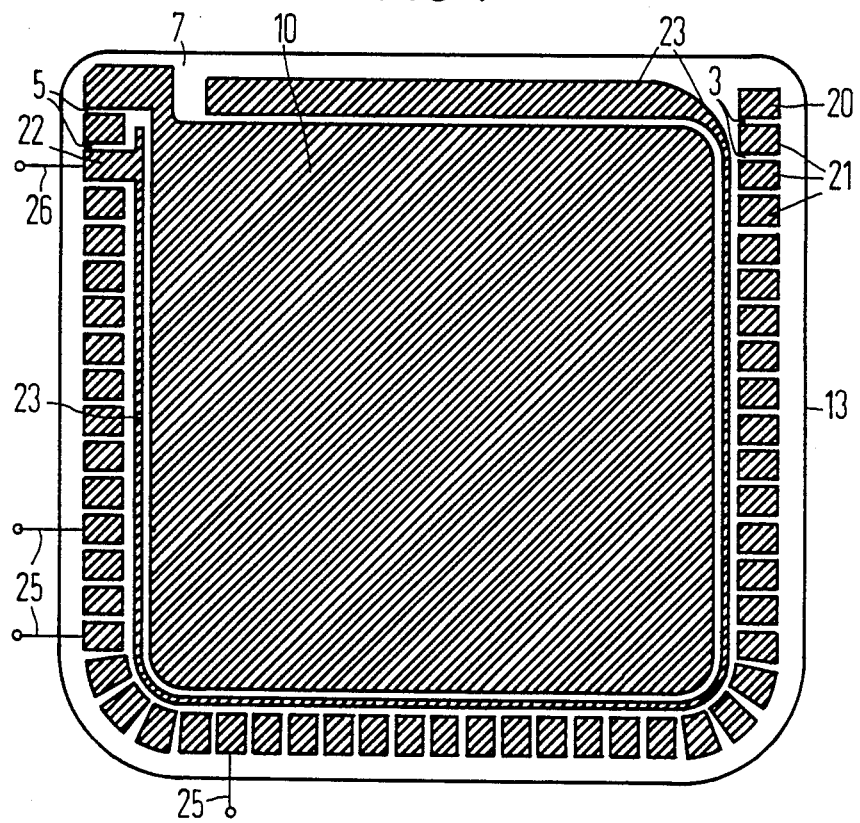

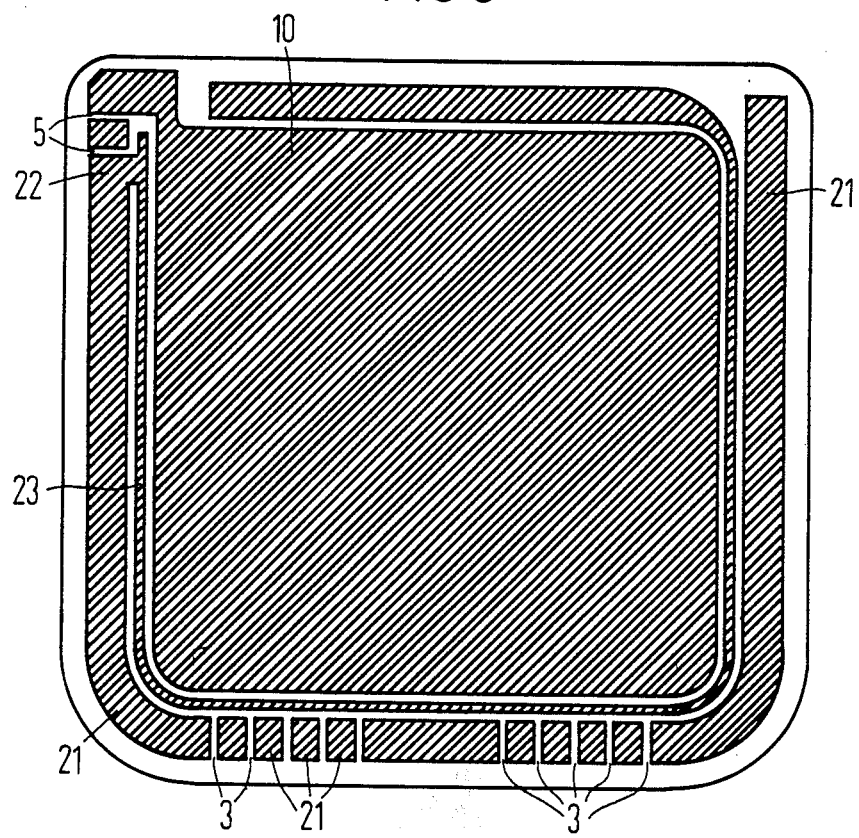

INTEGRATED CIRCUIT FOR THE PROTECTION OF SUBSCRIBER LINES AGAINST OVERVOLTAGES

The invention relates to an integrated circuit for the protection of subscriber lines against overvoltages.

Protective components which are connected between a subscriber line and ground, are used for the protection of subscriber lines against lightning strikes or overvoltages induced by electric railroads, for instance. The protective components are constructed in such a way that they break down below an overvoltage that is dangerous to the communications exchange and allow the current caused by the overvoltage flow off to ground.

Four-layer diodes which fire above a given, so-called protective voltage, have already been proposed as protective components, in German Published, Non-Prosecuted Application DE-OS No. 34 28 067. However, the operators of communication networks require different protective voltages of some 10 volts to several 100 volts. This means that for every protective voltage, a four-layer diode constructed for a definite breakdown voltage must be developed. Since the breakdown voltage of such four-layer diodes depends decisively on its resistivity, besides the thickness of the central zone, semiconductor materials with different basic dopings must always be kept in stock. Since the resistivity of the semiconductor material can vary considerably even within a production lot, this means that the protective components must be selected practically piece by piece, with regard to their breakdown voltage.

It is accordingly an object of the invention to provide an integrated circuit for protecting subscriber lines against overvoltages, which overcomes the hereinafore-mentioned disadvantages of the heretofore-known devices of this general type, and which has a protection voltage that is independent of the resistivity of the semiconductor material and can be varied within wide limits.

With the foregoing and other objects in view there is provided, in accordance with the invention, an integrated circuit for protecting subscriber lines against overvoltages, comprising a semiconductor body; a field-controllable thyristor having a gate electrode, an anode electrode and a cathode electrode, the gate electrode being insulated from the semiconductor body; a resistor connected between the cathode electrode and the gate electrode; a series circuit of Zener diodes connected between the gate electrode and the anode electrode, each of the Zener diodes having an anode electrode and a cathode electrode; and short circuit jumpers each being connected between the anode electrode and the cathode electrode of a respective one of at least part of the Zener diodes; at least part of the jumpers being interrupted corresponding to a predetermined breakdown voltage of the series circuit; and the thyristor having a larger breakdown voltage than the combined breakdown voltages of the Zener diodes of the series circuit of Zener diodes.

In accordance with another feature of the invention, there is provided at least one other Zener diode connected parallel to the resistor.

In accordance with a further feature of the invention, the semiconductor body has a central zone, a surface and an edge; the thyristor has an anode side and a cathode side; the thyristor is formed of four zones of alternating conduction type centrally disposed in the semiconductor body, including an anode zone on the anode side, a base zone on the anode side, a base zone on the cathode side, and a cathode zone on the cathode side; the base zone on the cathode side is embedded planar in the base zone on the anode side, and the base zone on the cathode side emerges to the surface of the semiconductor body between the cathode zone and the edge of the semiconductor body; a gate electrode covers the base zone on the cathode side; the Zener diodes have anode zones embedded planar in the central zone between the thyristor and the edge of the semiconductor body, and cathode zones embedded planar in the anode zones; the Zener diodes include a first Zener diode and other mutually adjacent Zener diodes disposed in a row along the edge of the semiconductor body; a metal layer connects the cathode zone of the first Zener diode to the base zone on the anode side of the thyristor or to the anode zone of the thyristor; other metal layers each connect the anode zone of a respective one of the Zener diodes to the cathode zone of the Zener diode adjacent thereto; and each of the short circuit jumpers is formed of a metal layer contacting the anode zone and the cathode zone of a respective one of the Zener diodes.

In accordance with an added feature of the invention, there is provided a housing enclosing the semiconductor body, and at least one connecting conductor connected to at least part of the metal layers and guided outside through the housing.

In accordance with an additional feature of the invention, there is provided a housing enclosing the semiconductor body, and a connecting conductor connected to the gate electrode and guided outside through the housing.

In accordance with yet another feature of the invention, there is provided a conducting connection between the base zone on the anode side of the thyristor and the cathode zone of one of the Zener diodes located between the gate electrode and the anode zone, the conducting connection passing through the anode zone of the Zener diode.

In accordance with yet a further feature of the invention, the metal layer of one of the Zener diodes is disposed between the gate electrode and the anode zone, and one of the short circuit jumpers connects the metal layer of the one Zener diode directly to the base zone on the anode side of the thyristor.

In accordance with yet an added feature of the invention, the Zener diodes are rated for a voltage of 6 V.

In accordance with a concomitant feature of the invention, the base zone on the anode side is formed of a less heavily doped layer and a more heavily doped layer, and the less heavily doped layer borders the base zone on the anode side.

Other features which are considered as characteristic for the invention are set forth in the appended claims.

Although the invention is illustrated and described herein as embodied in an integrated circuit for the protection of subscriber lines against overvoltages, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 3 is a fragmentary, top-plan view of a portion of an integrated circuit; and FIGS. 4 and 5 are top-plan views of two integrated circuits with different breakdown voltages.

Figure 1:
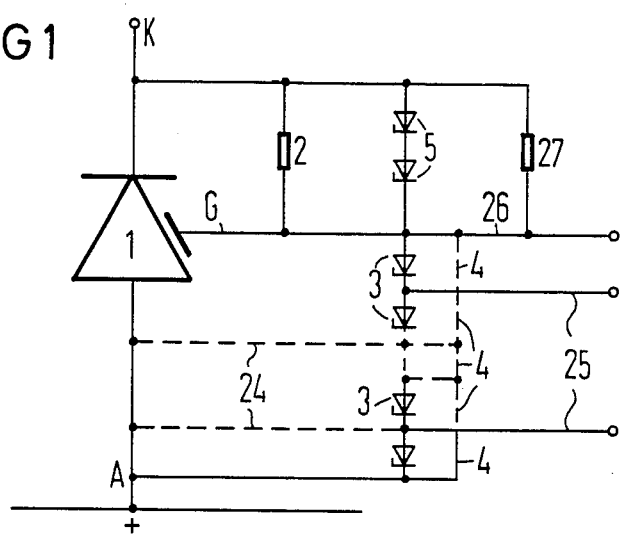
FIG. 1 is a schematic circuit diagram of the circuit according to the invention.

Referring now to the figures of the drawings in detail and first, particularly, to FIG. 1 thereof, there is seen a circuit which contains a field-controlled thyristor 1 which may be connected between a subscriber line and ground, for instance. If the circuit is to protect against overvoltages of both polarities, the thyristor is connected between the d-c terminals of a d-c bridge, having a-c voltage terminals connected to the two conductors of the line. A resistor 2 is connected between a cathode terminal K and a gate terminal G of the thyristor. A series circuit of Zener diodes 3 is connected between the gate terminal G and an anode terminal A of the thyristor. Each of the Zener diodes is provided with a short circuit jumper 4 which is connected between the anode terminal and the cathode terminal of the respective Zener diode. At least one of the short circuit jumpers is interrupted, so that at least the Zener voltage of one Zener diode drops across the gate terminal and the anode terminal of the thyristor 1. In the illustrated embodiment, all of the short circuit jumpers 4 are assumed to be interrupted, except for the jumper of the lowest Zener diode. The voltage between the gate and the anode is then determined as $(n-1) U_z$ if n is the number of Zener diodes 3.

In order to protect the gate/source capacity of the thyristor 1, it is advantageous to shunt the resistor with a Zener diode 5 or with a series circuit of several Zener diodes.

If an overvoltage occurs between the anode and the cathode of the thyristor 1, the series circuit formed by the Zener diodes 3 breaks down at a voltage which corresponds to the sum of the Zener voltages of the non-shorted Zener diodes. A current then flows through the resistor 2 and charges the gate/source capacity of the thyristor 1. The thyristor is therefore fired and shorts the subscriber line to ground. After the overvoltage ceases, the gate/source capacity of the thyristor 1 is discharged and the thyristor cuts off if the interference current falls below the holding current. The subscriber line is consequently operational again.

Figure 2:
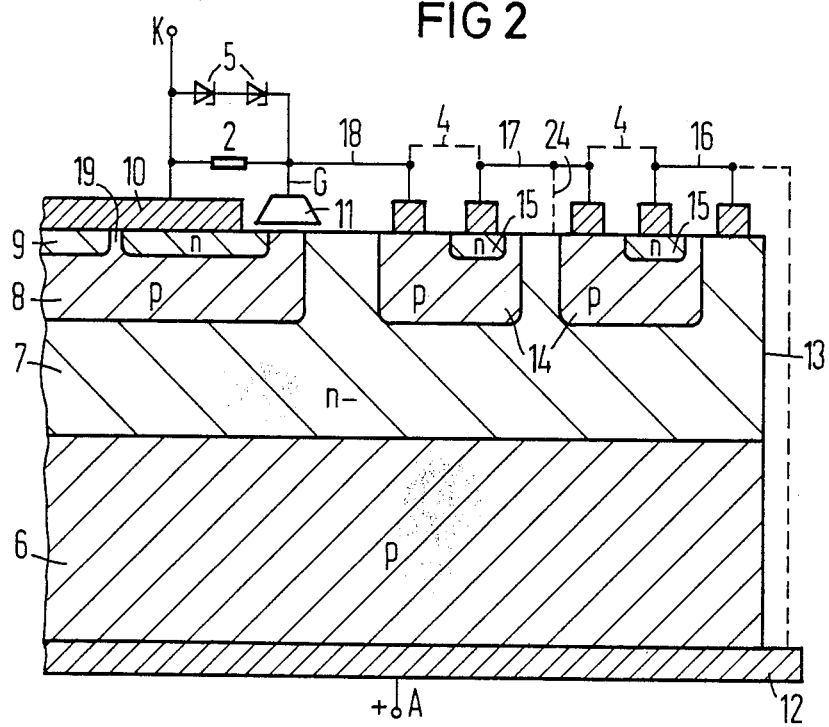
FIG. 2 is a fragmentary, diagrammatic, cross-sectional view of the integrated circuit according to FIG. 1.

The integrated circuit according to FIG. 2 has a substrate 6 with a doping level of a first conduction or conductivity type, which may be heavily p-doped, for instance. The substrate 6 serves as the anode zone of the thyristor. A less heavily doped central zone 7 of the opposite conduction or conductivity type is applied to the substrate 6. The opposite conduction type is the n-conduction type in the illustrated embodiment. The central zone 7 is the base zone of the thyristor on the anode side. A zone 8 of the first conduction type is embedded in a planar fashion in the central zone 7. The zone 8 is doped more heavily than the zone 7 and forms the base zone of the thyristor on the cathode side. The base zone 8 is also the gate zone of an integrated MOSFET. A zone 9 of the second conduction type is embedded in the base zone 8 in planar fashion. The zone 9 is doped more heavily than the zone 8 and serves as a cathode zone. The zone 9 can also be considered as the source zone of the MOSFET.

The cathode zone 9 is provided with a cathode electrode 10. Shunts 19, only one of which is shown in the drawing, are disposed between the gate zone and the cathode zone. Besides improving the du/dt strength, the shunts serve for increasing the holding current of the thyristor, so that it is cut off during normal communication operation.

The zones 6, 7, 8 and 9 form the thyristor. The thyristor is preferably disposed in the center of the semiconductor body in order to achieve optimum heat removal. The gate zone emerges to the surface of the semiconductor body on the cathode side, between the cathode zone 9 and an edge 13 of the semiconductor body. At that location, the gate zone is covered by a gate electrode 11 which is insulated from the base zone 8 by a non-illustrated insulating layer. The gate electrode 11 is connected through a Zener diode 5 or a series circuit of several Zener diodes 5 and the parallel-connected resistor 2, to the cathode electrode 10.

The Zener diodes are advantageously disposed between the thyristor and the edge 13 of the semiconductor body. The Zener diodes are formed of anode zones 14 which are embedded in planar fashion in the base zone 7 on the anode side. A cathode zone 15 is embedded in planar fashion in each of the anode zones 14. Advantageously, the depth and doping of the zones 14 and 15 correspond to the zones 8 and 9, respectively, and therefore they can be produced simultaneously with the zones 8 and 9.

The cathode zone 15 of the Zener diode adjacent the edge, which will be referred to below as the first Zener diode for short, is connected to the central zone 7 by a conductor 16. If the p-n junction between the zones 6 and 7 is biased in the forward direction, the anode potential minus the forward voltage of the p-n junction between the zones 6 and 7 is present at the cathode zone 15 of the first Zener diode. However, the cathode zone 15 of the first Zener diode could also be connected directly to an anode electrode 12, as shown by broken lines.

The anode zone 14 of the first Zener diode is connected by a line 17 to the cathode zone of the second Zener diode. The anode zone of the second Zener diode is connected by a line 18 to the gate electrode 11. The short-circuit jumpers 4, both of which are shown in the interrupted condition, are connected between the anode zone and the cathode zone of the Zener diodes. If an overvoltage between the anode and the cathode occurs, the sum of the Zener voltages of both Zener diodes plus the above-mentioned forward voltage is then present at the gate electrode 11. The gate-source capacity of the field-controlled thyristor is then charged with this voltage, and the thyristor is fired.

The connecting lines 16, 17 and 18 as well as the shorting jumpers 4 are provided in the form metal films in the integrated circuit. FIG. 3 shows a fragmentary top view onto a portion of an integrated circuit with three Zener diodes. The cathode zone 15 of the first Zener diode located at the extreme right is connected to the central zone 7 by a conductor run 20. The conductor run 20 is electrically insulated from the anode zone 15 by a non-illustrated insulation layer. The anode zone 15 of the first Zener diode is connected to the cathode zone of the second Zener diode by a conductor run 21. The conductor run 21 is electrically insulated from the anode zone 14 and the central zone 7. The anode zone of the second Zener diode is connected by a conductor run 22 to the cathode zone 15 of the third Zener diode; the conductor run 21 is likewise electrically insulated from the central zone 7. The anode zone of the third Zener diode is contacted by a conductor run 21 which leads to the cathode zone of the next Zener diode. The anode zone 14 of the third Zener diode is short-circuited by a short-circuit jumper 4 which is also in the firm if a conductor run. The third Zener diode is therefore not operative.

FIG. 4 is a top view of a first embodiment of the integrated circuit. For the sake of greater clarity, only the semiconductor body with the applied metal layers 10 is shown. The thyristor is centrally disposed in the semiconductor body; the thyristor along with the cathode electrode 10 occupy the major portion of the semiconductor body. The cathode zone and the cathode electrode 10 of the thyristor are respectively surrounded by the gate electrode which is covered by the metal layer 23. The Zener diodes 3 and 5 are disposed between the gate electrode and the edge of the semiconductor body. Advantageously, the Zener diodes are disposed individually in a row, so that the thyristor has the largest possible area available in the center of the semiconductor body. The gate electrode 23 is connected by a conductor run 22 to the cathode zone of a Zener diode 5 or the anode zone of the last of several series-connected Zener diodes 3.

In the embodiment according to FIG. 4, all of the short-circuit jumpers are interrupted, so that the breakdown voltage of the thyristor is given by the sum of the Zener voltages of all of the Zener diodes 3 integrated on the semiconductor body.

In the embodiment according to FIG. 5, a total of ten short-circuit jumpers are interrupted. With this construction, the breakdown voltage is $10 \times U_z$ or 60 V, for instance. A Zener voltage of 6 V is advisable because up to this voltage, the Zener effect alone is responsible for the breakdown. For all practical purposes it is not temperature-dependent.

The protective components are advantageously constructed in such a way that initially all of the Zener diodes are short-circuited by the short circuit jumpers. The short circuit jumpers are then removed in dependence on the desired protection voltage. A large range of desired protection voltages can therefore be covered with one component. The material properties of the thyristor are immaterial in this case as long as the breakdown voltage of the thyristor is so large that it is larger than the sum of all of the Zener diodes 3 which are integrated in the semiconductor body and are located between the gate electrode and the anode zone. Instead of an interruption of the short circuit jumpers 4, short circuit jumpers 24 can also be used to connect one of the Zener diodes 3 directly to the base zone 7 as shown if FIG. 2 or to the anode zone 6 as shown in FIG. 1. Then, the breakdown voltage is obtained from the sum of the Zener voltages of the Zener diodes 3 connected between the gate electrode 11 and the shorting jumper 24.

It is also possible to the provide connecting lines between the Zener diodes with connecting conductors 25 shown in FIG. 1 which are brought to the outside through the housing of the device. Thus, the protection voltage can be set by the operator of the communication network. A combination of short circuits which are set fixed and short circuits which can be set selectably, is also possible.

It is also conceivable to set a fixed protection voltage by means of connecting the cathode zone 15 of one of the Zener diodes 3 to the base zone 7 by direct wiring, such as with a laser beam, destroying the corresponding anode zone 14. If overcurrent protection is desired as well as overvoltage protection, it is advisable to provide the gate electrode 11 in FIG. 1 with a lead 26 and to bring the lead to the outside through the housing. A low resistance resistor 27 is then connected between the lead 26 and the cathode terminal K.

The foregoing is a description corresponding in substance to German Application No. P 35 39 108.1, dated Nov. 4, 1985, the International priority of which is being claimed for the instant application, and which is hereby made part of this application. Any material discrepancies between the foregoing specification and the aforementioned corresponding German application are to be resolved in favor of the latter.

We claim:

1. Integrated circuit for protecting subscriber lines against overvoltages, comprising a semiconductor body with a field-controllable thyristor having a gate electrode, an anode electrode and a cathode electrode, said gate electrode being insulated from said semiconductor body; a resistor connected between said cathode electrode and said gate electrode; a series circuit of Zener diodes connected between said gate electrode and said anode electrode, each of said Zener diodes having an anode electrode and a cathode electrode; and short circuit jumpers each being connected between said anode electrode and said cathode electrode of a respective one of at least part of said Zener diodes; at least part of said jumpers being interrupted to set the breakdown voltage of said series circuit to a predetermined value; and said thyristor having a larger breakdown voltage than the combined breakdown voltages of said Zener diodes of said series circuit of Zener diodes.

2. Integrated circuit according to claim 1, including at least one other Zener diode connected parallel to said resistor.

3. Integrated circuit according to claim 1, wherein:
   (a) said semiconductor body has a central zone, a surface and an edge;
   (b) said thyristor has an anode side and a cathode side;
   (c) said thyristor is formed of four zones of alternating conduction type centrally disposed in said semiconductor body, including an anode zone on said anode side, a base zone on said anode side, a base zone on said cathode side, and a cathode zone on said cathode side;
   (d) said base zone on said cathode side is embedded planar in said base zone on said anode side, and said base zone on said cathode side emerges to said surface of said semiconductor body between said cathode zone and said edge of said semiconductor body;
   (e) a gate electrode covers said base zone on said cathode side;
   (f) said Zener diodes have anode zones embedded planar in said central zone between said thyristor and said edge of said semiconductor body, and cathode zones embedded planar in said anode zones;
   (g) said Zener diodes include a first Zener diode and other mutually adjacent Zener diodes disposed in a row along said edge of said semiconductor body;

(h) a metal layer connects said cathode zone of said first Zener diode to said base zone on said anode side;

(i) other metal layers each connect said anode zone of a respective one of said Zener diodes to said cathode zone of said Zener diode adjacent thereto; and (j) each of said short circuit jumpers is formed of a metal layer contacting said anode zone and said cathode zone of a respective one of said Zener diodes.

4. Integrated circuit according to claim 3, including a housing enclosing said semiconductor body, and at least one connecting conductor connected to at least part of said metal layers and guided outside through said housing.

5. Integrated circuit according to claim 3, including a housing enclosing said semiconductor body, and a connecting conductor connected to said gate electrode and guided outside through said housing.

6. Integrated circuit according to claim 3, including a conducting connection between said base zone on said anode side of the thyristor and said cathode zone of one of said Zener diodes located between said gate electrode and said anode zone, said conducting connection passing through said anode zone of said Zener diode.

7. Integrated circuit according to claim 3, wherein said metal layer of one of said Zener diodes is disposed between said gate electrode and said anode zone, and one of said short circuit jumpers connects said metal layer of said one Zener diode directly to said base zone on said anode side of said thyristor.

8. Integrated circuit according to claim 3, wherein said base zone on said anode side is formed of a less heavily doped layer and a more heavily doped layer, and said less heavily doped layer borders said base zone on said cathode side.

9. Integrated circuit according to claim 1, wherein said Zener diodes are rated for a voltage of 6 V.

10. Integrated circuit according to claim 1, wherein:

(a) said semiconductor body has a central zone, a surface and an edge;

(b) said thyristor has an anode side and a cathode side;

(c) said thyristor is formed of four zones of alternating conduction type centrally disposed in said semiconductor body, including an anode zone on said anode side, a base zone on said anode side, a base zone on said cathode side, and a cathode zone on said cathode side;

(d) said base cone on said cathode side is embedded planar in said base zone on said anode side, and said base zone on said cathode side emerges to said surface of said semiconductor body between said cathode zone and said edge of said semiconductor body;

(e) a gate electrode covers said base zone on said cathode side;

(f) said Zener diodes have anode zones embedded planar in said central zone between said thyristor and said edge of said semiconductor body, and cathode zones embedded planar in said anode zones;

(g) said Zener diodes include a first Zener diode and other mutually adjacent Zener diodes disposed in a row along said edge of said semiconductor body;

(h) a metal layer connects said cathode zone of said first Zener diode to said anode zone on said anode side;

(i) other metal layers each connect said anode zone of a respective one of said Zener diodes to said cathode zone of said Zener diode adjacent thereto; and (j) each of said short circuit jumpers is formed of a metal layer contacting said anode zone and said cathode zone of a respective one of said Zener diodes.

11. Integrated circuit according to claim 10, including a housing enclosing said semiconductor body, and at least one connecting conductor connected to at least part of said metal layers and guided outside through said housing.

12. Integrated circuit according to claim 10, including a housing enclosing said semiconductor body, and a connecting conductor connected to said gate electrode and guided outside through said housing.

13. Integrated circuit according to claim 10, including a conducting connection between said base zone on said anode side of the thyristor and said cathode zone of one of said Zener diodes located between said gate electrode and said anode zone, said conducting connection passing through said anode zone of said Zener diode.

14. Integrated circuit according to claim 10, wherein said metal layer of one of said Zener diodes is disposed between said gate electrode and said anode zone, and one of said short circuit jumpers connects said metal layer of said one Zener diode directly to said base zone on said anode side of said thyristor.

15. Integrated circuit according to claim 10, wherein said base zone on said anode inside is formed of a less heavily doped layer and a more heavily doped layer, and said less heavily doped layer borders said base zone on said cathode side.

* * * * *